United States Patent
Redjem Saad et al.

(10) Patent No.: US 10,488,033 B2
(45) Date of Patent: Nov. 26, 2019

(54) DEVICE FOR COOLING A LIGHT SOURCE

(71) Applicant: VALEO VISION, Bobigny (FR)

(72) Inventors: Lotfi Redjem Saad, Bobigny (FR); Sylvain Tournemine, Bobigny (FR); Christophe Duval, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/926,195

(22) Filed: Mar. 20, 2018

(65) Prior Publication Data

US 2018/0274775 A1    Sep. 27, 2018

(30) Foreign Application Priority Data

Mar. 21, 2017 (FR) ...................... 17 52327

(51) Int. Cl.
| | |
|---|---|
| *F21V 29/77* | (2015.01) |
| *H01S 5/024* | (2006.01) |
| *F21V 29/71* | (2015.01) |
| *F21S 45/49* | (2018.01) |
| *F21S 45/43* | (2018.01) |
| *F21S 41/141* | (2018.01) |
| *B60Q 1/04* | (2006.01) |
| *F21K 9/90* | (2016.01) |

(Continued)

(52) U.S. Cl.
CPC .............. *F21V 29/773* (2015.01); *B60Q 1/04* (2013.01); *F21K 9/90* (2013.01); *F21S 41/141* (2018.01); *F21S 45/43* (2018.01); *F21S 45/49* (2018.01); *F21V 29/713* (2015.01); *H01S 5/02407* (2013.01); *F21Y 2115/10* (2016.08); *H01S 5/02212* (2013.01); *H01S 5/02284* (2013.01); *H01S 5/02469* (2013.01)

(58) Field of Classification Search
CPC ...... F21V 29/773; F21V 29/713; F21S 45/43; F21S 45/49; F21S 41/141; B60Q 1/04; F21K 9/90; H01S 5/02407
USPC ........................................................ 362/373
See application file for complete search history.

(56) References Cited

U.S. PATENT DOCUMENTS

| | | | | |
|---|---|---|---|---|
| 7,458,706 B1 * | 12/2008 | Liu | ........................ | F21V 29/004 362/294 |
| 7,637,629 B1 * | 12/2009 | Roberts | ................. | H01J 61/526 362/264 |

(Continued)

FOREIGN PATENT DOCUMENTS

| | | |
|---|---|---|
| DE | 10 2006 001 711 A1 | 7/2007 |
| WO | WO 2014/00741 A1 | 1/2014 |

OTHER PUBLICATIONS

French Preliminary Search Report dated Dec. 12, 2017 in French Application 17 52327 filed Mar. 21, 2017 (with English Translation of Categories of Cited Documents).

*Primary Examiner* — Bryon T Gyllstrom
(74) *Attorney, Agent, or Firm* — Oblon, McClelland, Maier & Neustadt, L.L.P.

(57) ABSTRACT

Device for cooling a light source, laser diode, including a first heatsink equipped with a core provided with a bore extending along a lighting axis and forming a housing for receiving such a light source, and including first fins extending from the core outward, wherein the device includes a second heatsink that has second fins extending toward the lighting axis from a peripheral portion arranged around the lighting axis, at least one second fin of the second heatsink being at least partially interleaved between first fins of the first heat sink.

19 Claims, 3 Drawing Sheets

(51) Int. Cl.
*F21Y 115/10* (2016.01)
*H01S 5/022* (2006.01)

(56) References Cited

U.S. PATENT DOCUMENTS

| | | | |
|---|---|---|---|
| 8,814,397 B2* | 8/2014 | Breidenassel | F21K 9/00 |
| | | | 362/294 |
| 2007/0279862 A1* | 12/2007 | Li | F21V 29/004 |
| | | | 361/692 |
| 2009/0135613 A1* | 5/2009 | Peng | F21K 9/233 |
| | | | 362/373 |
| 2010/0132931 A1 | 6/2010 | Liaw et al. | |
| 2010/0149817 A1* | 6/2010 | MacKinnon | G03B 21/16 |
| | | | 362/294 |
| 2011/0037368 A1* | 2/2011 | Huang | F21V 29/02 |
| | | | 313/46 |
| 2012/0161602 A1* | 6/2012 | Yu | F21V 29/507 |
| | | | 313/46 |
| 2013/0294093 A1 | 11/2013 | Ahn | |
| 2014/0218932 A1 | 8/2014 | Huang | |
| 2015/0323169 A1* | 11/2015 | Kuriyama | F21K 9/233 |
| | | | 362/294 |
| 2016/0363308 A1* | 12/2016 | Shum | H05B 33/089 |

* cited by examiner

DEVICE FOR COOLING A LIGHT SOURCE

TECHNICAL FIELD OF THE INVENTION

The invention relates to a device for cooling a light source, in particular a laser diode. It also relates to a motor-vehicle headlamp unit comprising such a device for cooling a light source. It also relates to a motor vehicle equipped with such a headlamp unit or with such a device for cooling a light source. Lastly, it relates to a process for manufacturing such a device for cooling a light source.

PRIOR ART

A light source, particularly a laser diode, needs to be cooled, in particular when it is intended to illuminate the road in front of a motor vehicle. Specifically, a motor vehicle may be subjected to very high exterior temperatures when the driver needs to turn on his lights. This is for example the case during very hot summer nights. However, if the temperature exceeds a certain threshold, the lighting function is greatly decreased, or even completely suppressed.

Prior-art cooling solutions often prove to be insufficient. In addition, they tend to increase the area of heat exchange surfaces, this leading to bulky cooling devices. However, the large number of pieces of equipment within motor vehicles makes the integration of bulky cooling devices difficult.

SUBJECT OF THE INVENTION

The aim of the present invention is to provide a compact and effective solution for cooling a light source, in particular a laser diode, and that is particularly compatible with use within a vehicle.

To do so, the invention is based on a device for cooling a light source, in particular a light-emitting LED or laser diode, comprising a first heatsink equipped with a core provided with a bore extending along a lighting axis and forming a housing for receiving such a light source, and comprising first fins extending from the core outward, the cooling device comprising a second heatsink that has second fins extending toward the lighting axis from a peripheral portion arranged around the lighting axis, at least one second fin of the second heatsink being at least partially interleaved between first fins of the first heat sink.

According to a first variant, the first heatsink and the second heatsink are two separate parts that are interleaved with each other.

According to a second variant, the first heatsink in the second heatsink are integrally formed, i.e. they form a single part.

The second heatsink may comprise a lateral plate substantially perpendicular to the lighting axis, in particular a circular lateral plate provided with a central hole that is substantially coaxial with the lighting axis, arms possibly extending outward from the lateral plate to the peripheral portion, these arms possibly holding the peripheral portion substantially coaxially with the lighting axis.

The lateral plate of the second heatsink may have an interior face in contact with an annular face of the core of the first heatsink in order to allow heat to be dissipated from the first heatsink to the second heatsink.

The core of the first heatsink may be substantially cylindrical and the peripheral portion of the second heatsink may be substantially cylindrical.

The distal ends of the first fins of the first heatsink may be inscribed in a circle of diameter smaller than the diameter in which the interior wall of the peripheral portion of the second heatsink is inscribed.

The first and second fins, respectively, of the first and second heatsinks, may be all partially or completely interleaved.

Each second fin of the second heatsink may be placed between two first fins of the first heatsink, so that a space remains between the first and second fins.

The peripheral portion of the second heatsink may be inscribed in a cylinder of diameter comprised between 40 and 60 mm, or even between 40 and 100 mm.

The cooling device may comprise a fan of axis substantially coaxial with the lighting axis, placed facing an exterior face of the lateral plate of the second heatsink, able to generate an air current that penetrates into the first and second heatsinks in order to induce cooling of these heatsinks by convection level with their fins.

The core of the first heatsink may form a component for holding a light source and in particular a holder allowing the connection between a laser diode and an optical fiber.

The invention also relates to a headlamp unit for a motor vehicle, said unit comprising a cooling device such as described above.

The invention also relates to a motor vehicle comprising a cooling device such as described above and/or a headlamp unit for a motor vehicle such as described above.

The invention lastly relates to a process for manufacturing a device for cooling a light source such as described above, comprising the following steps:

obtaining by extrusion and/or molding, optionally followed by one or more machining operations, the first heatsink;

obtaining by extrusion and/or molding, optionally followed by one or more machining operations, the second heatsink.

According to one variant embodiment, the first heatsink and the second heatsink are integrally formed and are extruded and/or molded simultaneously, optionally followed by one or more machining operations.

BRIEF DESCRIPTION OF THE DRAWINGS

Other advantages and features will become more clearly apparent from the following description of one embodiment of the invention, which embodiment is given by way of nonlimiting example and shown in the appended drawings, in which.

DESCRIPTION OF EMBODIMENTS OF THE INVENTION

FIGS. 1 to 6 illustrate a device 100 for cooling a light source, in particular a laser diode 30, able to illuminate in front, or even behind, a motor vehicle 1 according to one preferred embodiment of the invention.

Figure 1:
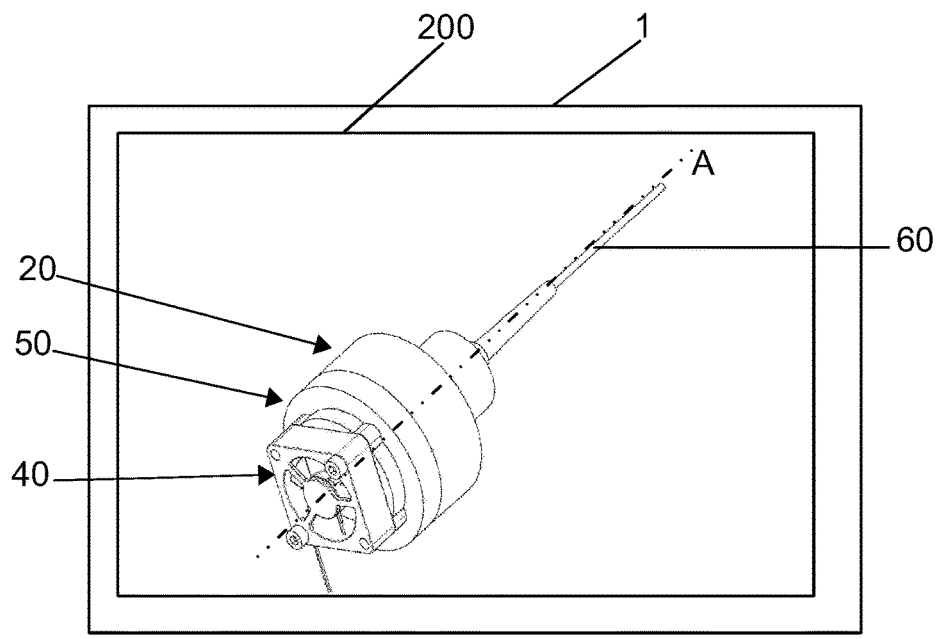
FIG. 1 shows a perspective view of a device for cooling a light source according to one embodiment of the invention.

As schematically illustrated in FIG. 1, the motor vehicle 1 is equipped with a headlamp unit 200. A light source extending along a lighting axis A, via the optical fiber 16, is cooled by the cooling device 100.

It will be noted that in FIGS. 1, 2, 3 and 5, for the sake of convenience, the lighting axis A is illustrated as being substantially coaxial with the light source, the optical fiber 60 being illustrated rectilinear. It is necessary to understand that the light is created in the light source, then is transmitted to the optical fiber 60 via a first end coupled to the light source, before exiting from a second end of the optical fiber 60. Thus, the light source may be placed independently with respect to the lighting direction, the optical fiber 60 not necessarily being rectilinear and possibly making one or more turns.

Figure 2:
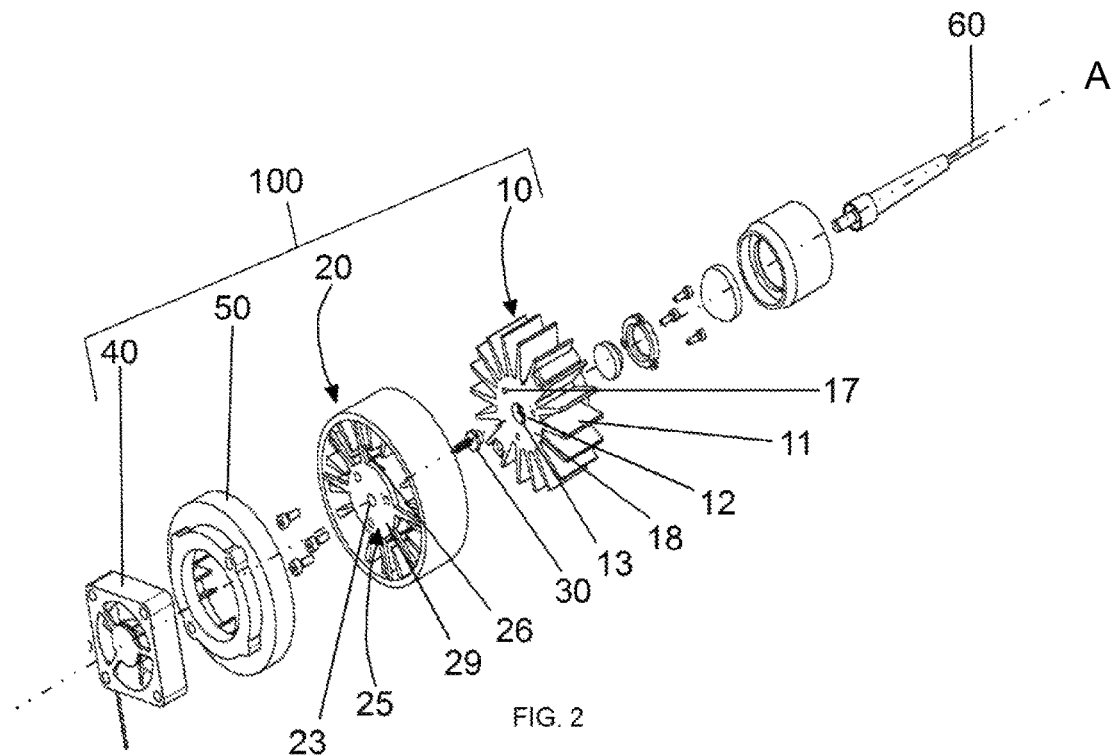
FIG. 2 shows an exploded perspective view of a light source extending along a lighting axis A, said source being equipped with a cooling device according to the embodiment of the invention.

According to one embodiment, the headlamp unit 200 comprises a cooling device 100 such as illustrated in FIG. 2. The cooling device 100 comprises a first heatsink 10, a second heatsink 20, a diffuser 50, and a fan 40.

The first heatsink 10 has a hand in holding the laser diode 30. This laser diode 30 is of substantially cylindrical shape, possibly of axis substantially coaxial with the lighting axis A, as illustrated in the figures, and optionally comprises a shoulder. A core 12 of the first heatsink 10 then forms a component for holding the laser diode 30. Specifically, this core 12 is provided with a bore 13 that extends along the lighting axis A and that forms a housing for receiving the laser diode 30. This bore 13 has a diameter such that the laser diode 30 inserts therein with a functional play so that as much of the heat emanating from the laser diode 30 as possible is transferred to the core 12. Furthermore, the core 12 has a holding function allowing the laser diode 30 and the optical fiber 60 to be coupled.

Figure 3:
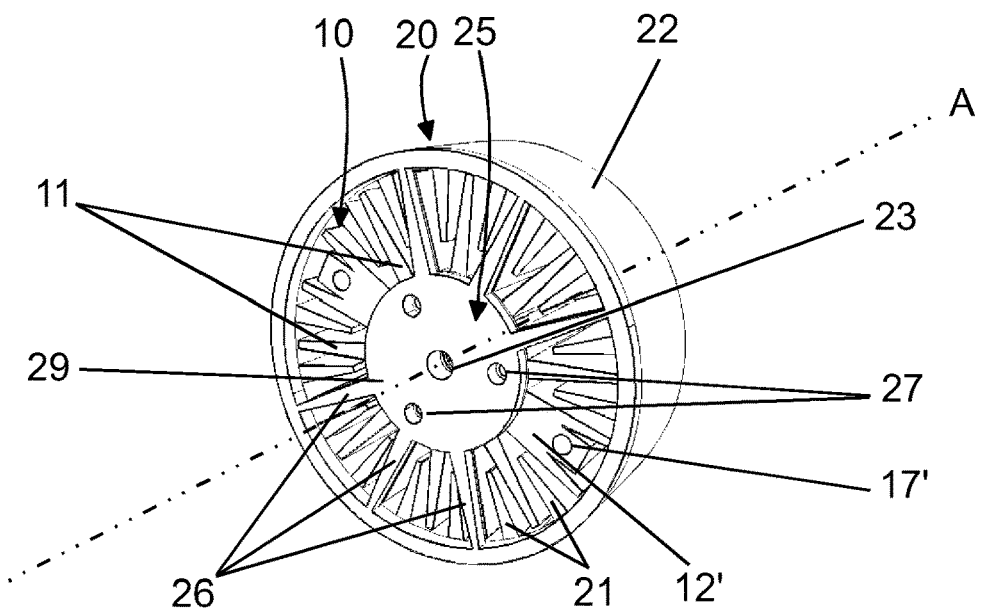
FIG. 3 shows a perspective view of a first and second heatsink of the cooling device according to the embodiment of the invention.

With reference to FIGS. 2 and 3, the fan 40 is able to blow or suck fresh air in the direction of an exterior face 29 of a lateral plate 25 of the second heatsink 20. The arrangement is such that the air sucked in by the fan 40 passes through the two heatsinks 10, 20, in order to promote cooling thereof by convection. The fan 40 has an axis of rotation substantially coaxial with the lighting axis A. The fan 40 is able to suck cool air into the second heatsink 20 after the air has passed through a diffuser 50. The fan 40 is also able to blow, i.e. to pump out hot air, for demisting for example.

Figure 4:
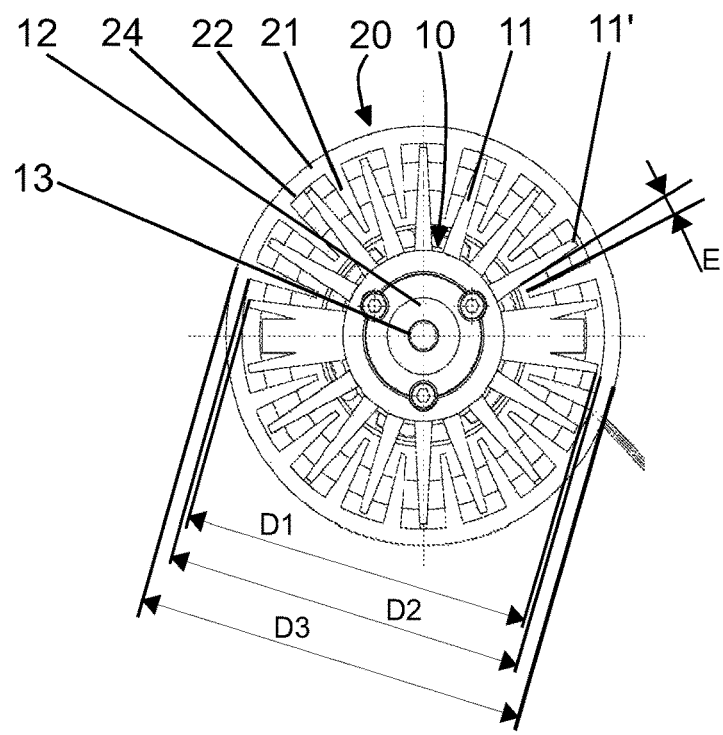
FIG. 4 shows a face-on view of a first and second heatsink of the cooling device according to the embodiment of the invention.

As illustrated in FIGS. 2, 3 and 4, the first heatsink 10 has first fins 11 extending, radially from the lighting axis A in this embodiment, from the core 12 outward. The second heatsink 20 has second fins 21 extending toward the lighting axis A. Specifically, a peripheral portion 22 of the second heatsink 20 is arranged around the lighting axis A and comprises the second fins 21 extending, likewise radially, inward. In the illustrated embodiment, the core 12 of the first heatsink 10 and the peripheral portion 22 of the second heatsink 20 are substantially cylindrical. The peripheral portion 22 may also have a different shape, for example a parallelepipedal shape, in particular of square cross section, substantially aligned with the casing of the fan 40.

The first and second heatsinks 10, 20 are arranged, such as shown in FIGS. 3 and 4, so that all the second fins 21 of the second heatsink 20 are placed between two first fins 11 of the first heatsink 10. As a variant, the first and second fins 11, 21 may be interleaved according to different architectures. For example, at least one second fin 21 is interleaved between first fins 11. There may be two or more second fins 21 interleaved between first fins 11. The width of the first and second fins 11, 21, measured along the lighting axis A, may be equal, and the two ends of these first and second fins 11, 21 may be aligned, i.e. be located substantially in two respective planes perpendicular to the lighting axis A. As a variant, the first and second fins 11, 21 may be slightly offset in the direction along the lighting axis A. Thus, any interleaving in which at least one first fin 11 and one second fin 21 have respective surfaces facing and in proximity allows a first compactness effect and a second effect of combined participation in cooling to be obtained. Complete interleaving, as in the embodiment, is particularly optimal.

Advantageously, the cooling device 100 comprises at least three first and three second fins 11, 21. In the illustrated embodiment, eighteen first fins 11 and sixteen second fins 21 are implemented. Naturally, different numbers of first and second fins 11, 21 may be suitable.

As mentioned above, the second heatsink 20 comprises a lateral plate 25. This lateral plate 25, substantially perpendicular to the lighting axis A, is provided with a central hole 23 substantially coaxial with the lighting axis A. Arms (or branches) 26, that are six in number in the illustrated embodiment, preferably extend radially outward from the lateral plate 25 to the peripheral portion 22. The arms 26 hold the peripheral portion 22 substantially coaxially with the lighting axis A. The number of arms 26 may obviously be lower than six, it being understood that at least one arm 26 and preferably an even number of arms 26 is required. In the illustrated embodiment, the lateral plate 25 is circular. As mentioned above, the exterior face 29 of the lateral plate 25 faces the fan 40.

Figure 5:
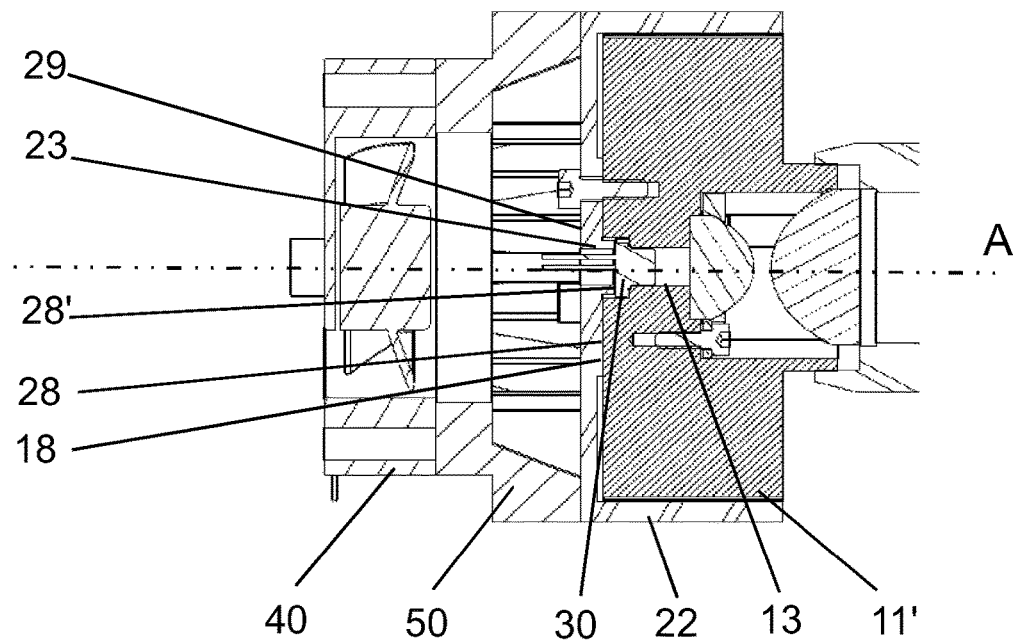
FIG. 5 shows a cross-sectional view, cut in a plane containing the lighting axis A, of a light source equipped with the cooling device according to the embodiment of the invention.

The interior face 28 of the lateral plate 25 of the second heatsink 20 is located facing an annular face 18 of the core 12 of the first heatsink 10 as FIG. 5 shows. More precisely, the arrangement of the first heatsink 10 with the second heatsink 20 is such that the interior face 28 of the lateral plate 25 makes contact with the annular face 18 of the core 12. Via this arrangement, the first heatsink 10, which receives all or most of the heat originating from the laser diode 30, transmits some of this heat to the second heatsink 20, by thermal conduction level with the contact between the lateral plate 25 and the annular face 18 of the core 12. In addition, an annular portion 28', in particular originating from a shoulder, on the side of the interior face 28 of the lateral plate 25, makes contact with the laser diode 30, in order to directly receive some of the heat generated by the laser diode 30, i.e. from the bottom of the light source.

In summary, the cooling device 100 allows heat to be conducted from the laser diode 30 to the first heatsink 10 and to the second heatsink 20. Specifically, the laser diode 13 makes contact with the first heatsink 10 level with the bore 13 of the core 12. In addition, since the interior face 28 of the lateral plate 25 makes contact with the annular face 18 of the core 12, heat is transferred by conduction from the core 12 to the lateral plate 25. Thus, heat transfer by conduction also takes place from the first heatsink 10 to the second heatsink 20. Since the heat emanating from the laser diode 30 is transmitted to the first and second heatsinks 10, 20, it is then preferable that they be able to be cooled rapidly in order to optimally play their heat-dissipating role.

Thus, within each heatsink 10, 20, the heat is in particular distributed to the various fins in order to promote the dissipation of heat and the cooling of the assembly. The second heatsink 20 may dissipate by conduction some of the heat of the lateral plate 25 via the arms 26 then to the peripheral portion 22, and lastly to the fins 21.

Furthermore, the fan 40 generates an air flow that flows between the first and second fins 11, 21, this having the effect of improving the cooling of the first fins 11, by forced convection. The second fins 21 and the peripheral portion 22 then play an air-guiding role, thus optimizing the convection effect and contributing to cooling of the first heatsink 10 and second heatsink 20.

Furthermore, as illustrated in FIG. 3, the central hole 23 of the lateral plate 25 may be directly aligned with the back of the laser diode 30.

Advantageously, as illustrated in FIG. 4, the distal ends 11' of the first fins 11 of the first heatsink 10 are inscribed in a cylinder of diameter D1 smaller than the diameter D2 of the cylinder in which the interior wall 24 of the peripheral portion 22 of the second heatsink 20 is inscribed. Thus, the distal ends 11' of the first fins 11 do not make contact with the peripheral portion 22 of the second heatsink 20, but are in proximity to this peripheral portion 22. In this way, the first fins 11 occupy a maximum volume in the available space delineated by the peripheral portion 22.

In addition, each second fin 21 of the second heatsink 20 is arranged between two first fins 11 of the first heatsink 10, so that a minimum space E remains between the first and second fins 11, 21. This space E may for example be comprised between 1 mm and 4 mm, and preferably between 2 and 3 mm. Such an arrangement of the first and second fins 11, 21 and such separations between the first fins 11 and the second fins 21 maximize the forced convection. The effectiveness of the cooling increases as the area of the surface of exchange between the air and the first and second fins 11, 21 increases. It will be noted that the arrangement of the first and second fins 11, 21 may be different, as explained above, provided that these fins are interleaved so as to have respective surfaces in proximity to one another in order to promote the dissipation and/or to minimize bulk.

Preferably, (D2−D1) is lower than the value of the space E, or indeed (D2−D1)/2 is lower than the value of the space E. This is with the aim of forcing the air to pass where there is the most space, i.e. between the first and second fins 11, 21, and not between the distal ends 11' of the first fins 11 and the interior wall 24 of the peripheral portion 22 of the second heatsink 20.

Again with reference to FIG. 4, the peripheral portion 22 of the second heatsink 20 is advantageously inscribed in a cylinder of diameter D3 comprised between 40 and 100 mm, and preferably between 40 and 60 mm. The length along the lighting axis A of the first heatsink 10 interleaved in the second heatsink 20 is comprised between 30 and 50 mm, and is preferably about 35 mm.

Figure 6:
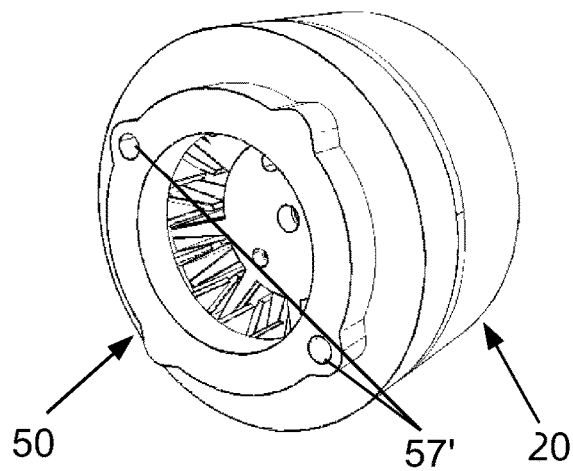
FIG. 6 shows a perspective view of a diffuser mounted on a first and second heatsink of the cooling device according to the embodiment of the invention.

FIGS. 5 and 6 in particular illustrate the compactness of the cooling device 100 comprising the fan 40, the diffuser 50 and the first and second heatsinks 10, 20. In FIG. 6, only the diffuser 50 and the first and second heatsinks 10, 20 may be seen. The small bulk of the cooling device 100 is due to the fact that the first heatsink 100 is interleaved within the second heatsink 20. In addition, the area of the heat exchange surface remains very large, in particular because of the first fins 11 and the second fins 21, this ensuring optimal cooling of the laser diode 30.

It will be noted that the first heatsink 10 may be held substantially centered within the second heatsink 20 by first fastening means such as screws or bolts. These first fastening means may use first bores 17 extending substantially parallel to the lighting axis A in the core 12 of the first heatsink 10. These first fastening means may also use first holes 27 parallel to the lighting axis A in the lateral plate 25 of the second heatsink 20. The first bore 17 or the first holes 27 may be tapped.

The diffuser 50 may be fastened by second fastening means, such as screws or bolts, to the first heatsink 10. The second fastening means may use second bores 17 extending substantially parallel to the lighting axis A in a widened base 12' between two first fins 11 of the first heatsink 10. The second fastening means may also use second holes 57' extending substantially parallel to the lighting axis A in a peripheral zone of the diffuser 50. The second bores 17' or the second holes 57' may be tapped.

As a variant (not illustrated) the first fins 11 of the first heatsink 10 and the second fins 21 of the second heatsink 20 have substantially the same length. As a result of this, the diameter D1 is equal or substantially equal to the diameter D2. Thus, the distal ends 11' of the first fins 11 almost make contact with the interior wall 24 of the peripheral portion 22.

It will be noted that the solution therefore achieves the desired objective of offering optimal cooling of a laser diode 30 while having a low bulk. It has the advantage of being inexpensive, the materials and techniques used to obtain the first and second heatsinks 10, 20 being widely employed. Specifically, they may be produced with commonplace materials such as an aluminum alloy, any metal, a plastic, for example a conductive plastic, or even an association of these materials. To obtain the first and second heatsink 10, 20, extrusion and/or molding, optionally followed by one or more machining operations, form particularly advantageous manufacturing steps.

The invention is particularly well-suited to the cooling of a light source, such as a light-emitting LED or laser diode, intended for the lights of a motor vehicle. It also relates to a headlamp unit of a motor vehicle as such incorporating such a device for cooling a light source. It also relates to a motor vehicle as such incorporating such a headlamp unit or such a device for cooling a light source. Lastly, it relates to a process for manufacturing such a device for cooling a light source.

The invention claimed is:

1. Device for cooling a light source, or a light-emitting LED or laser diode, comprising:
    a first heatsink equipped with a core provided with a bore extending along a lighting axis and forming a housing for receiving such a light source, and comprising first fins extending from the core outward, and
    a second heatsink that has second fins extending toward the lighting axis from a peripheral portion arranged around the lighting axis, at least one second fin of the second heatsink being at least partially interleaved between first fins of the first heatsink,
    wherein the second fins are not in contact with the first heatsink, and
    the second heatsink comprises a lateral plate substantially perpendicular to the lighting axis, in particular a circular lateral plate provided with a central hole that is substantially coaxial with the lighting axis, arms extending outward from the lateral plate to the peripheral portion, these arms holding the peripheral portion substantially coaxially with the lighting axis.

2. Cooling device according to claim 1, wherein the lateral plate of the second heatsink has an interior face in contact with an annular face of the core of the first heatsink in order to allow heat to be dissipated from the first heatsink to the second heatsink.

3. Cooling device according to claim 1, wherein the core of the first heatsink is substantially cylindrical and wherein the peripheral portion of the second heatsink is substantially cylindrical.

4. Cooling device according to claim 1, wherein the distal ends of the first fins of the first heatsink are inscribed in a circle of diameter smaller than a diameter of the peripheral portion of the second heatsink is inscribed.

5. Cooling device according to claim 1, wherein the first and second fins, respectively, of the first and second heatsinks, are all partially or completely interleaved.

6. Cooling device according to claim 1, wherein each second fin of the second heatsink is placed between two first fins of the first heatsink, so that a space remains between the first and second fins.

7. Cooling device according to claim 1, wherein the peripheral portion of the second heatsink is inscribed in a cylinder of diameter comprised between 40 and 60 mm, or even between 40 and 100 mm.

8. Cooling device according to claim 1, wherein the device comprises a fan with an axis substantially coaxial with the lighting axis, placed facing an exterior face of the lateral plate of the second heatsink, configured to generate an air current that penetrates into the first and second heatsinks in order to induce cooling of the first and second heatsinks by convection with the first and second fins.

9. Cooling device according to claim 1, wherein the core of the first heatsink forms a component for holding a light source and a holder allowing the connection between a laser diode and an optical fiber.

10. Headlamp unit for a motor vehicle, said unit comprising a cooling device according to claim 1.

11. Process for manufacturing a device for cooling a light source according to claim 1, wherein the process comprises the following steps:
    obtaining by extrusion and/or molding, optionally followed by one or more machining operations, the first heatsink; and
    obtaining by extrusion and/or molding, optionally followed by one or more machining operations, the second heatsink.

12. Cooling device according to claim 1, wherein:
    the first heatsink comprises a first lateral plate substantially perpendicular to the lighting axis and having a plurality of first bores extending through the first lateral plate,
    the lateral place of the second heatsink comprises a plurality of second bores extending through the lateral plate, and
    the first bores are arranged in a pattern to correspond with a pattern of the second bores.

13. Cooling device according to claim 12, wherein the first and second lateral plates are substantially circular.

14. Cooling device according to claim 12, wherein the first lateral plate is attached to the second lateral plate using a fixing means located in the first and second bores.

15. Cooling device according to claim 1, wherein:
    the first heatsink comprises a first lateral plate substantially perpendicular to the lighting axis and having first and second lateral faces substantially perpendicular to the lighting axis disposed opposite to each other,
    the lateral plate of the second heatsink comprises a third lateral face substantially perpendicular to the lighting axis,
    the first lateral face is attached to the third lateral face, and
    one of the light source, LED and laser diode is attached to the second lateral face.

16. Cooling device according to claim 1, wherein the first fins are not in contact with the second heatsink.

17. Device for cooling a light source, comprising:
    a first heatsink comprising a core extending along a lighting axis of the light source and forming a housing for receiving the light source, and comprising first fins outwardly extending from the core,
    a second heatsink comprising a cylinder having a plate disposed at one end of the cylinder, spokes connecting the plate to the cylinder, and second fins extending inwardly from a peripheral portion of the cylinder toward the lighting axis,
    the second fins forming a bore,
    the core disposed in the bore in contact with the plate, and
    the first fins being interleaved with the second fins,
    wherein the second fins are not in contact with the first heatsink.

18. Motor vehicle comprising: a cooling device according to claim 17, and a headlamp unit for said motor vehicle.

19. Cooling device according to claim 17, wherein the first fins are not in contact with the second heatsink.

* * * * *